(12) United States Patent
Hase et al.

(10) Patent No.: US 9,804,248 B2
(45) Date of Patent: Oct. 31, 2017

(54) BATTERY MONITORING DEVICE

(71) Applicant: KABUSHIKI KAISHA TOYOTA JIDOSHOKKI, Aichi (JP)

(72) Inventors: Ryusuke Hase, Kariya (JP); Takahiro Tsuzuku, Kariya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 0 days.

(21) Appl. No.: 15/127,245

(22) PCT Filed: Dec. 1, 2014

(86) PCT No.: PCT/JP2014/081709
§ 371 (c)(1),
(2) Date: Sep. 19, 2016

(87) PCT Pub. No.: WO2015/145873
PCT Pub. Date: Oct. 1, 2015

(65) Prior Publication Data
US 2017/0168130 A1  Jun. 15, 2017

(30) Foreign Application Priority Data
Mar. 26, 2014 (JP) ................................. 2014-063345

(51) Int. Cl.
*G01N 27/416* (2006.01)
*G01R 35/00* (2006.01)
(Continued)

(52) U.S. Cl.
CPC .......... *G01R 35/00* (2013.01); *B60L 11/1851* (2013.01); *G01R 31/02* (2013.01); *G01R 31/3658* (2013.01)

(58) Field of Classification Search
USPC ................................................ 320/426, 106
See application file for complete search history.

(56) References Cited

U.S. PATENT DOCUMENTS 5,105,426 A    4/1992  Hagiwara
8,829,716 B2 * 9/2014  Tinglow ............... H02J 7/0016
                                              307/65
(Continued)

FOREIGN PATENT DOCUMENTS

JP      1-279652      11/1989
JP     2001-24643     1/2001
(Continued)

OTHER PUBLICATIONS

Written Opinion of the International Searching Authority for International Application No. PCT/JP2014/081709, dated Mar. 3, 2015, along with a partial English translation.
(Continued)

*Primary Examiner* — Samuel Berhanu
(74) *Attorney, Agent, or Firm* — Greenblum & Bernstein, P.L.C.

(57) ABSTRACT

Upon receiving a setting signal S1, each of a plurality of monitoring units transmits the first setting signal to the subsequent monitoring unit or a control unit, and in a case when it is not possible to receive the first setting signal, the monitoring unit transmits a second setting signal, which indicates an occurrence of a communication abnormality, to the subsequent monitoring unit or the control unit, and when receiving the second setting signal, it changes the received second setting signal so as to transmit the changed second setting signal to the subsequent monitoring unit or the control unit, while the control unit identifies the occurrence location of a communication abnormality in accordance with second setting signal transmitted from the last monitoring unit.

10 Claims, 16 Drawing Sheets

(51) Int. Cl.
    *G01R 31/36*     (2006.01)
    *G01R 31/02*     (2006.01)
    *B60L 11/18*     (2006.01)

(56) References Cited

U.S. PATENT DOCUMENTS

| | | | |
|---|---|---|---|
| 2010/0079116 A1* | 4/2010 | Thivierge | B60L 3/0046 |
| | | | 320/153 |
| 2010/0079146 A1* | 4/2010 | Kurose | B60L 3/0046 |
| | | | 324/433 |
| 2011/0273023 A1 | 11/2011 | Nishida et al. | |
| 2012/0217813 A1 | 8/2012 | Takeuchi et al. | |
| 2013/0193925 A1* | 8/2013 | Abe | H01M 10/44 |
| | | | 320/118 |
| 2016/0336736 A1* | 11/2016 | Nomura | H02J 7/0031 |

FOREIGN PATENT DOCUMENTS

| | | |
|---|---|---|
| JP | 2001-203733 | 7/2001 |
| JP | 2010-141971 | 6/2010 |
| JP | 2012-178936 | 9/2012 |

OTHER PUBLICATIONS

International Search Report in International Patent Application No. PCT/JP2014/081709, dated Mar. 3, 2015, along with an English translation.

\* cited by examiner

| DUTY RATIO OF RECEIVED RECTANGULAR WAVE | TYPE OF SIGNAL EQUIVALENT TO RECEIVED RECTANGULAR WAVE |
|---|---|
| 10% | SETTING SIGNAL S1 |
| 54% | SETTING SIGNAL S2 |
| 58% | SETTING SIGNAL S2 |
| 62% | SETTING SIGNAL S2 |
| 66% | SETTING SIGNAL S2 |
| 70% | SETTING SIGNAL S2 |

FIG. 4

| DUTY RATIO OF RECEIVED RECTANGULAR WAVE | OCCURRENCE LOCATION OF COMMUNICATION ABNORMALITY |
|---|---|
| 70% | BETWEEN CONTROL UNIT 3 AND MONITORING UNIT 10-1 |
| 66% | BETWEEN MONITORING UNITS 10-1 AND 10-2 |
| 62% | BETWEEN MONITORING UNITS 10-2 AND 10-3 |
| 58% | BETWEEN MONITORING UNITS 10-3 AND 10-4 |
| 54% | BETWEEN MONITORING UNITS 10-4 AND 10-5 |

FIG. 5

| DUTY RATIO OF RECEIVED RECTANGULAR WAVE | TYPE OF SIGNAL EQUIVALENT TO RECEIVED RECTANGULAR WAVE |
|---|---|
| 10% | SETTING SIGNAL S1 |
| 54% | SETTING SIGNAL S2 |
| 58% | SETTING SIGNAL S2 |
| 62% | SETTING SIGNAL S2 |
| 66% | SETTING SIGNAL S2 |
| 70% | SETTING SIGNAL S2 |
| 4% | SETTING SIGNAL S3 |
| 8% | SETTING SIGNAL S3 |
| 12% | SETTING SIGNAL S3 |
| 16% | SETTING SIGNAL S3 |
| 20% | SETTING SIGNAL S3 |
| 24% | SETTING SIGNAL S3 |

FIG. 8

| DUTY RATIO OF RECEIVED RECTANGULAR WAVE | IDENTIFICATION INFORMATION |
|---|---|
| 4% | 101 |
| 8% | 102 |
| 12% | 103 |
| 16% | 104 |
| 20% | 105 |

FIG. 9

| DUTY RATIO OF RECEIVED RECTANGULAR WAVE | NUMBER OF MONITORING UNITS |
|---|---|
| 8% | 1 |
| 12% | 2 |
| 16% | 3 |
| 20% | 4 |
| 24% | 5 |

FIG. 10

| DUTY RATIO OF RECEIVED RECTANGULAR WAVE | TYPE OF SIGNAL EQUIVALENT TO RECEIVED RECTANGULAR WAVE |
|---|---|
| 4% | SETTING SIGNAL S1 |
| 8% | SETTING SIGNAL S1 |
| 12% | SETTING SIGNAL S1 |
| 16% | SETTING SIGNAL S1 |
| 20% | SETTING SIGNAL S1 |
| 24% | SETTING SIGNAL S1 |
| 54% | SETTING SIGNAL S2 |
| 58% | SETTING SIGNAL S2 |
| 62% | SETTING SIGNAL S2 |
| 66% | SETTING SIGNAL S2 |
| 70% | SETTING SIGNAL S2 |

F I G. 1 3

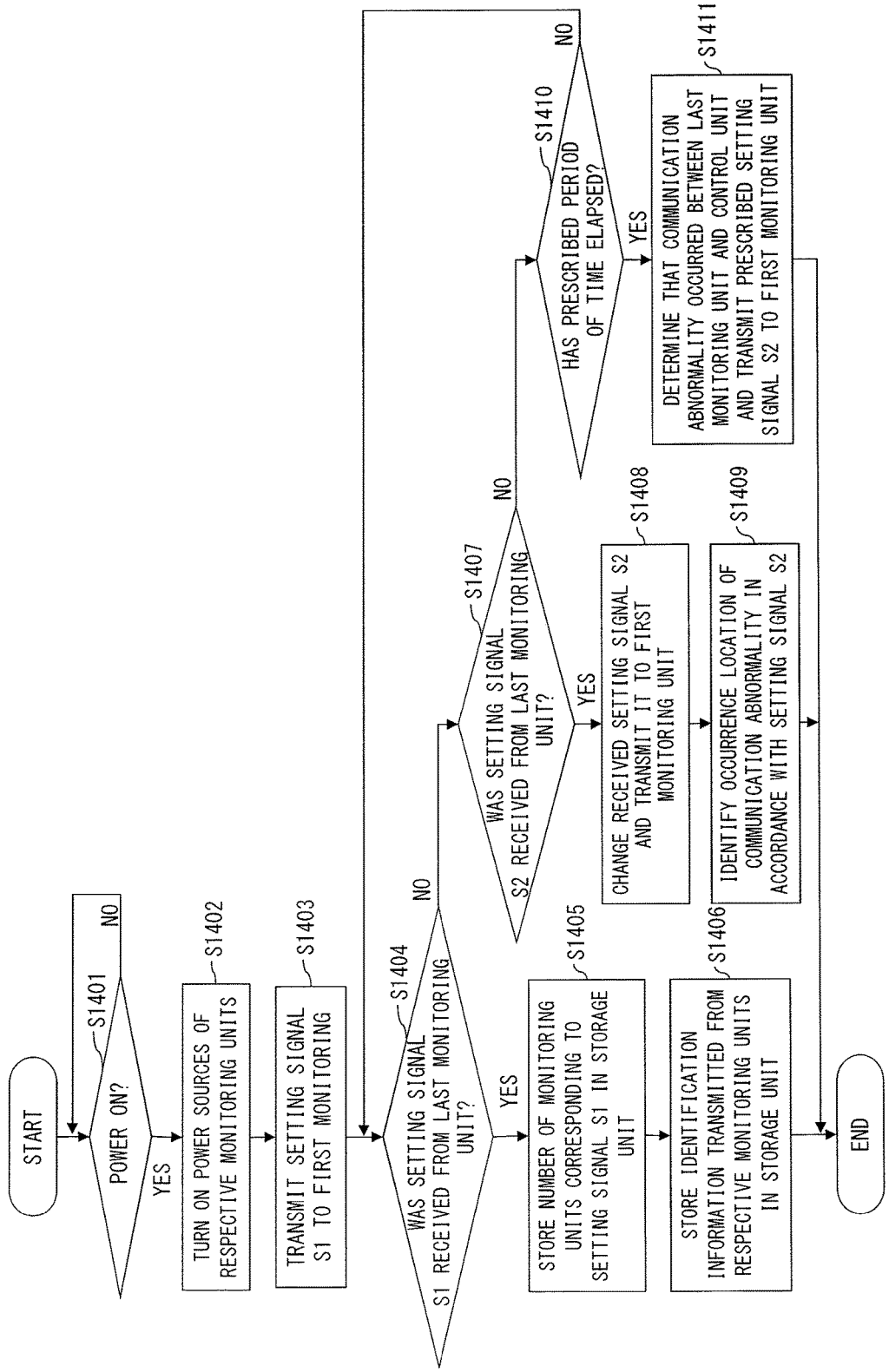
F I G. 14

(a)

| DUTY RATIO OF RECEIVED RECTANGULAR WAVE | OCCURRENCE LOCATION OF COMMUNICATION ABNORMALITY |
|---|---|
| 70% | BETWEEN MONITORING UNITS 10-1 AND 10-2 |
| 66% | BETWEEN MONITORING UNITS 10-2 AND 10-3 |
| 62% | BETWEEN MONITORING UNITS 10-3 AND 10-4 |
| 58% | BETWEEN MONITORING UNITS 10-4 AND 10-5 |
| 54% | BETWEEN MONITORING UNIT 10-5 AND CONTROL UNIT 3 |

(b)

| DUTY RATIO OF RECEIVED RECTANGULAR WAVE | OCCURRENCE LOCATION OF COMMUNICATION ABNORMALITY |
|---|---|
| 70% | BETWEEN MONITORING UNITS 10-2 AND 10-3 |
| 66% | BETWEEN MONITORING UNITS 10-3 AND 10-4 |
| 62% | BETWEEN MONITORING UNITS 10-4 AND 10-5 |
| 58% | BETWEEN MONITORING UNIT 10-5 AND CONTROL UNIT 3 |
| 54% | BETWEEN CONTROL UNIT 3 AND MONITORING UNIT 10-1 |

(c)

| DUTY RATIO OF RECEIVED RECTANGULAR WAVE | OCCURRENCE LOCATION OF COMMUNICATION ABNORMALITY |
|---|---|
| 70% | BETWEEN MONITORING UNITS 10-3 AND 10-4 |
| 66% | BETWEEN MONITORING UNITS 10-4 AND 10-5 |
| 62% | BETWEEN MONITORING UNIT 10-5 AND CONTROL UNIT 3 |
| 58% | BETWEEN CONTROL UNIT 3 AND MONITORING UNIT 10-1 |
| 54% | BETWEEN MONITORING UNITS 10-1 AND 10-2 |

(d)

| DUTY RATIO OF RECEIVED RECTANGULAR WAVE | OCCURRENCE LOCATION OF COMMUNICATION ABNORMALITY |
|---|---|
| 70% | BETWEEN MONITORING UNITS 10-4 AND 10-5 |
| 66% | BETWEEN MONITORING UNIT 10-5 AND CONTROL UNIT 3 |
| 62% | BETWEEN CONTROL UNIT 3 AND MONITORING UNIT 10-1 |
| 58% | BETWEEN MONITORING UNITS 10-1 AND 10-2 |
| 54% | BETWEEN MONITORING UNITS 10-2 AND 10-3 |

(e)

| DUTY RATIO OF RECEIVED RECTANGULAR WAVE | OCCURRENCE LOCATION OF COMMUNICATION ABNORMALITY |
|---|---|
| 70% | BETWEEN MONITORING UNIT 10-5 AND CONTROL UNIT 3 |
| 66% | BETWEEN CONTROL UNIT 3 AND MONITORING UNIT 10-1 |
| 62% | BETWEEN MONITORING UNITS 10-1 AND 10-2 |
| 58% | BETWEEN MONITORING UNITS 10-2 AND 10-3 |
| 54% | BETWEEN MONITORING UNITS 10-3 AND 10-4 |

FIG. 16

BATTERY MONITORING DEVICE

FIELD

The present invention is related to a technique of monitoring states of a plurality of batteries.

BACKGROUND

In recent years, there have been cases where a plurality of batteries are connected in parallel as a battery device mounted on vehicles such as electric forklift trucks, hybrid automobiles, electric automobiles, etc. in order to supply a large amount of electricity to the load in a stable manner.

Also, there is a battery monitoring device, for monitoring the state of each of such batteries, that is provided with a control unit for permitting the charging/discharging of each battery in accordance with the monitoring result of each battery. In these battery monitoring devices, identification information has to be set for each monitoring unit in order to transmit monitoring results from a plurality of monitoring units to the control unit, the monitoring units being for monitoring the states of the batteries.

As a related technique, there is a technique in which when for example respective monitoring units and the control unit are connected in series, each of the monitoring units adds, to a packet to be transmitted from a previous monitoring unit, information representing whether or not the identification information is set to itself so as to transmit it to a subsequent monitoring unit and the control unit sets identification information for a monitoring unit which is identified by the information added to a packet transmitted from the last monitoring unit and for which identification information is not set (Patent Document 1 for example).

Patent Document 1: Japanese Laid-open Patent Publication No. 2001-203733

SUMMARY

However, as described above, a communication abnormality such as disconnection of a communication line connecting each monitoring unit and the control unit, poor connection between communication connectors, etc. in a configuration where each monitoring unit and the control unit are connected in series may lead to a situation where pieces of identification information are updated for only some of the monitoring units, resulting in duplication of identification information and causing a malfunction of the battery monitoring device.

In response to the above situation, it may be possible to perform a communication abnormality detection process such as identifying an occurrence location of a communication abnormality prior to the identification information setting process.

It is an object of the present invention to provide a battery monitoring device that can perform a communication abnormality detection process in a case when respective monitoring units for monitoring respective states of a plurality of batteries and a control unit for communicating with each monitoring unit are connected in series.

A battery monitoring device according to the present embodiment includes a plurality of monitoring units that monitor a state of a battery, and a control unit that is connected to the plurality of monitoring units in series and that communicates with the plurality of monitoring units by using identification information set for the plurality of monitoring units.

Upon receiving a first setting signal transmitted from the previous monitoring unit or the control unit, each of the plurality of monitoring units transmits the first setting signal to the subsequent monitoring unit or the control unit.

In a case when it is not possible to receive the first setting signal, each of the plurality of monitoring units transmits a second setting signal, which indicates an occurrence of a communication abnormality and which is different from the first setting signal, to the subsequent monitoring unit or the control unit, and when receiving the second setting signal transmitted from the previous monitoring unit, each of the plurality of monitoring units changes the received second setting signal so as to transmit the changed second setting signal to the subsequent monitoring unit or the control unit.

The control unit identifies the occurrence location of a communication abnormality in accordance with the second setting signal transmitted from the last monitoring unit.

The present invention makes it possible to perform a communication abnormality detection process in a case when monitoring units for monitoring the states of a plurality of batteries and a control unit for communicating with the monitoring units are connected in series.

BRIEF DESCRIPTION OF DRAWINGS

FIG. 4 shows an example of information stored in a storage unit;

FIG. 5 shows an example of information stored in a storage unit;

FIG. 8 shows an example of information stored in a storage unit;

FIG. 9 shows an example of information stored in the storage unit;

FIG. 10 shows an example of information stored in the storage unit;

FIG. 13 shows an example of information stored in a storage unit;

FIG. 14 is a flowchart showing operations of a control unit according to a fourth embodiment;

FIG. 16 shows an example of information stored in a storage unit.

DESCRIPTION OF EMBODIMENTS

Figure 1:
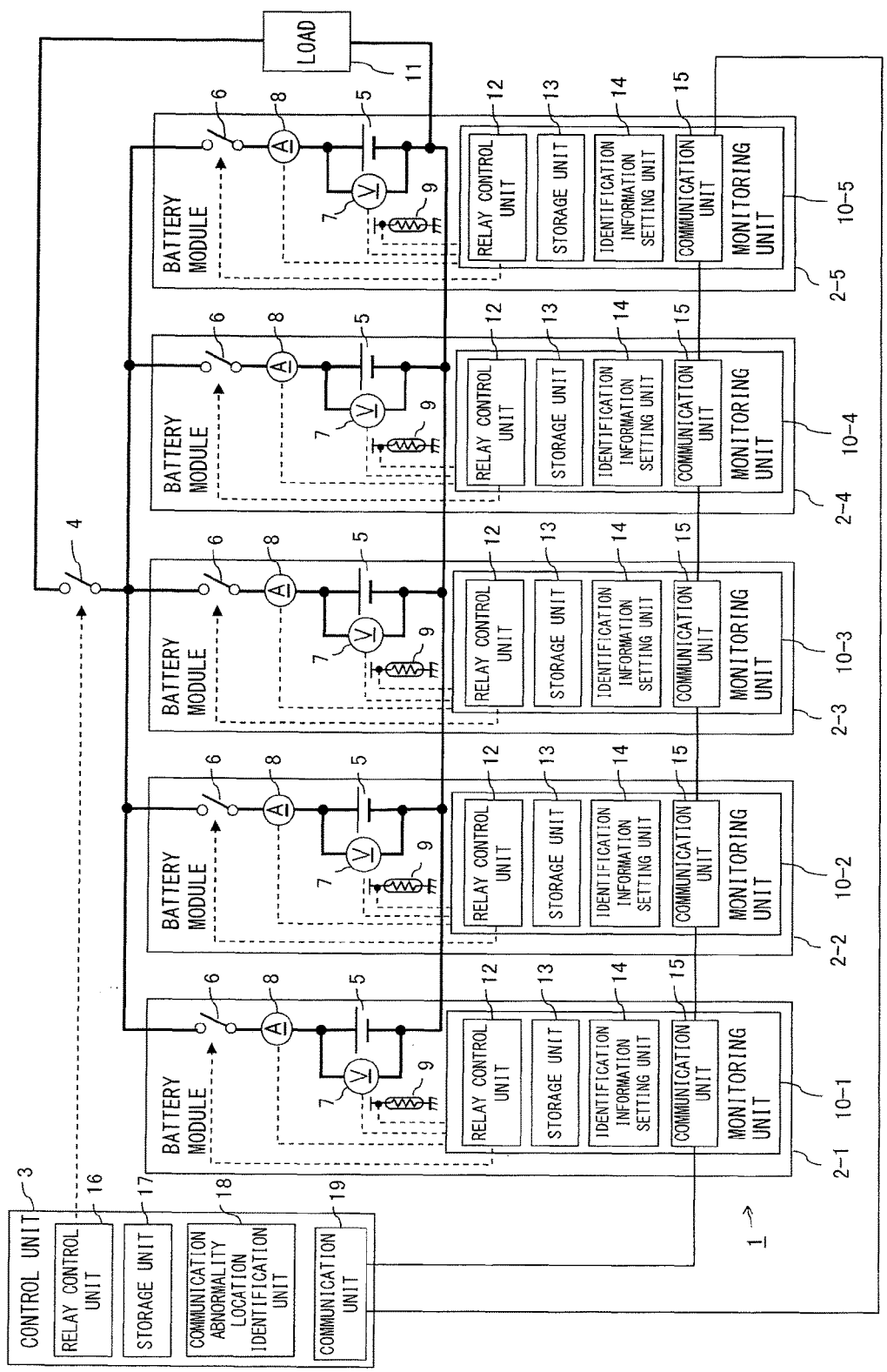
FIG. 1 shows a battery monitoring device of an embodiment.

FIG. 1 shows a battery monitoring device of an embodiment.

A battery monitoring device 1 shown in FIG. 1 includes five battery modules 2 (2-1 through 2-5), a control unit (battery Electronic Control Unit (ECU)) 3 and a main relay 4. The battery monitoring device 1 is mounted on a vehicle such as an electric forklift truck, a hybrid automobile, an electric automobile, etc. The number of the battery modules 2 is not limited to five.

The battery modules 2 (2-1 through 2-5) each have a battery 5, a relay 6, a voltage detection unit 7, a current detection unit 8, a temperature detection unit 9, and a monitoring unit (monitoring ECU) 10 (10-1 through 10-5). The respective batteries 5 are connected in parallel so as to supply electric power to a load 11 (such as other ECUs etc.)

The batteries 5 are rechargeable batteries and are for example a lithium-ion secondary battery, a nickel metal-hydride battery, etc. Note that the batteries 5 may be configured of a plurality of batteries that are connected in series.

The relays 6 are provided between the main relay 4 and the batteries 5. When the main relay 4 is turned on with the relays 6 in an on state, electric power can be supplied from the batteries 5 to the load 11.

The voltage detection units 7 detect voltages of the batteries 5, and are for example voltmeters.

The current detection units 8 detect currents flowing to the batteries 5 for charging and currents flowing from the battery 5 for discharging, and are for example ammeters.

The temperature detection units 9 detect ambient temperatures of the batteries 5, and are for example thermistors.

The monitoring units 10 (10-1 through 10-5) each have a relay control unit 12, a storage unit 13, an identification information setting unit 14 and a communication unit 15. The relay control units 12, the identification information setting units 14, and the communication units 15 are configured of for example CPUs (central processing units), multi-core CPUs, programmable devices (such as FPGAs (Field Programmable Gate Arrays), PLDs (Programmable Logic Devices), etc.), and are implemented by a CPU, a multi-core CPU, a programmable device, etc. reading and implementing a program stored in the storage unit 13. Also, the communication units 15 of the monitoring units 10-1 through 10-5 and a communication unit 19 of the control unit 3 are connected in series to form a loop via a communication line (daisy chain).

The relay control units 12 perform on/off control for the relays 6.

The storage units 13 are for example a ROM (read only memory), a RAM (random access memory), etc., and store various types of information and various types of programs.

The identification information setting units 14 set the identification information for themselves, and store that identification information in the storage units 13. When for example five pieces of identification information of "101" through "105" are set for the monitoring units 10-1 through 10-5, the identification information setting unit 14 of the first monitoring unit 10-1 sets "101" as the identification information for itself and stores it in the storage unit 13. Also, the identification information setting unit 14 of the second monitoring unit 10-2 sets "102" as the identification information for itself and stores it in the storage unit 13. Also, the identification information setting unit 14 of the third monitoring unit 10-3 sets "103" as the identification information for itself and stores it in the storage unit 13. Also, the identification information setting unit 14 of the fourth monitoring unit 10-4 sets "104" as the identification information for itself and stores it in the storage unit 13. Also, the identification information setting unit 14 of the last monitoring unit 10-5 sets "105" as the identification information for itself and stores it in the storage unit 13.

The communication units 15 receive signals transmitted from the previous monitoring units 10 or the control unit 3 and transmit signals to the subsequent monitoring units 10 or the control unit 3.

The control unit 3 includes a relay control unit 16 that performs the on/off control of the main relay 4, a storage unit 17, a communication abnormality location identification unit 18 and a communication unit 19 that communicates with the monitoring units 10-1 through 10-5. Note that the storage unit 17 is for example a ROM or a RAM, and stores various types of information and programs. Also, the relay control unit 16, the communication abnormality location identification unit 18 and the communication unit 19 are configured of for example CPUs, multi-core CPUs, programmable devices, etc., and are implemented by a CPU, a multi-core CPU, a programmable device, etc. reading and implementing a program stored in the storage unit 17. The control unit 3 receives, via the communication unit 19, pieces of identification information transmitted from the monitoring units 10-1 through 10-5, and stores them in the storage unit 17. Also, the control unit 3 receives, via the communication unit 19 and by using identification information stored in the storage unit 17, information representing the states of the batteries 5 (for example, the voltages, currents, temperatures, etc. of the batteries 5) transmitted from the monitoring units 10-1 through 10-5. Also, when the state of the battery 5 represented by received information enters a prescribed state (when for example at least one of the voltage, current and temperature of the battery 5 is greater than a threshold), the control unit 3 determines the state of the battery 5 to be abnormal and shifts to the evacuation running mode (for example, a process in which it transmits, to a higher-order control unit that controls the movement of the vehicle, an instruction to gradually slow down the vehicle before a prescribe period of time elapses and turns off the main relay 4 by using the relay control unit 16 after the prescribed period of time elapses). Also, upon determining that a communication abnormality has occurred, the control unit 3 shifts to the evacuation running mode.

First Embodiment

Figure 2:
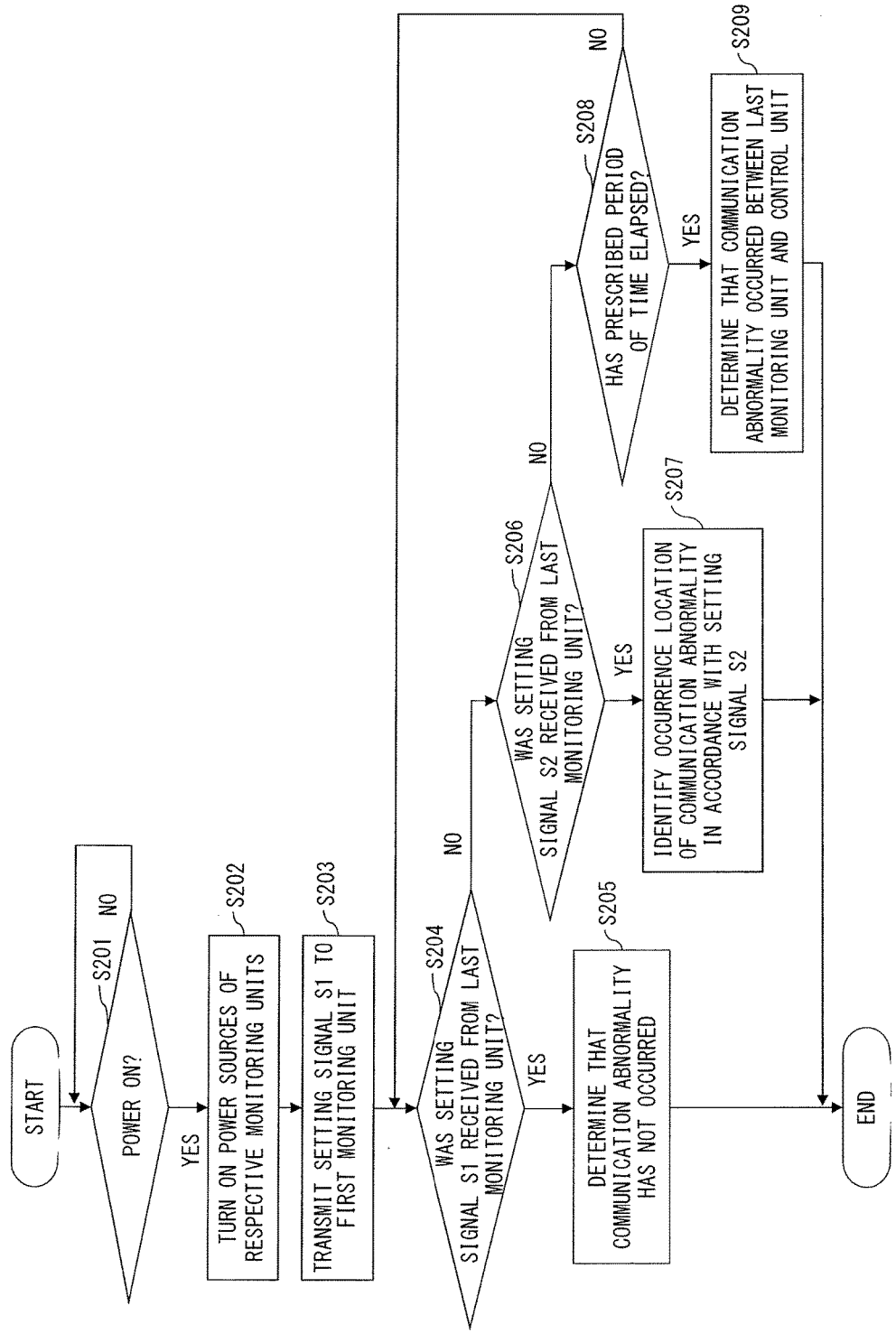
FIG. 2 is a flowchart showing operations of a control unit according to a first embodiment.

FIG. 2 is a flowchart showing operations of the control unit 3 of the first embodiment.

When the power source of the control unit 3 is turned on (Yes in S201), the control unit 3 turns on the power sources of the monitoring units 10-1 through 10-5 (S202) and transmits setting signal S1 (first setting signal) to the first monitoring unit 10-1 (S203).

Next, upon receiving a setting signal S1 transmitted from the last monitoring unit 10-5 (Yes in S204), the control unit 3 determines that a communication abnormality has not occurred (S205).

Also, upon receiving a setting signal S2 (second setting signal) that is transmitted from the last monitoring unit 10-5 and that indicates the occurrence of a communication abnormality (No in S204 and Yes in S206), the control unit 3 identifies the occurrence location of the communication abnormality in accordance with received setting signal S2 (S207).

Also, when the control unit 3 has not received setting signal S1 or S2 from the last monitoring unit 10-5 after the elapse of a prescribed period of time after transmission of setting signal S1 to the first monitoring unit 10-1 (No in S206 and Yes in 208), the control unit 3 determines that a communication abnormality has occurred between the last monitoring unit 10-5 and the control unit 3 (S209).

Figure 3:
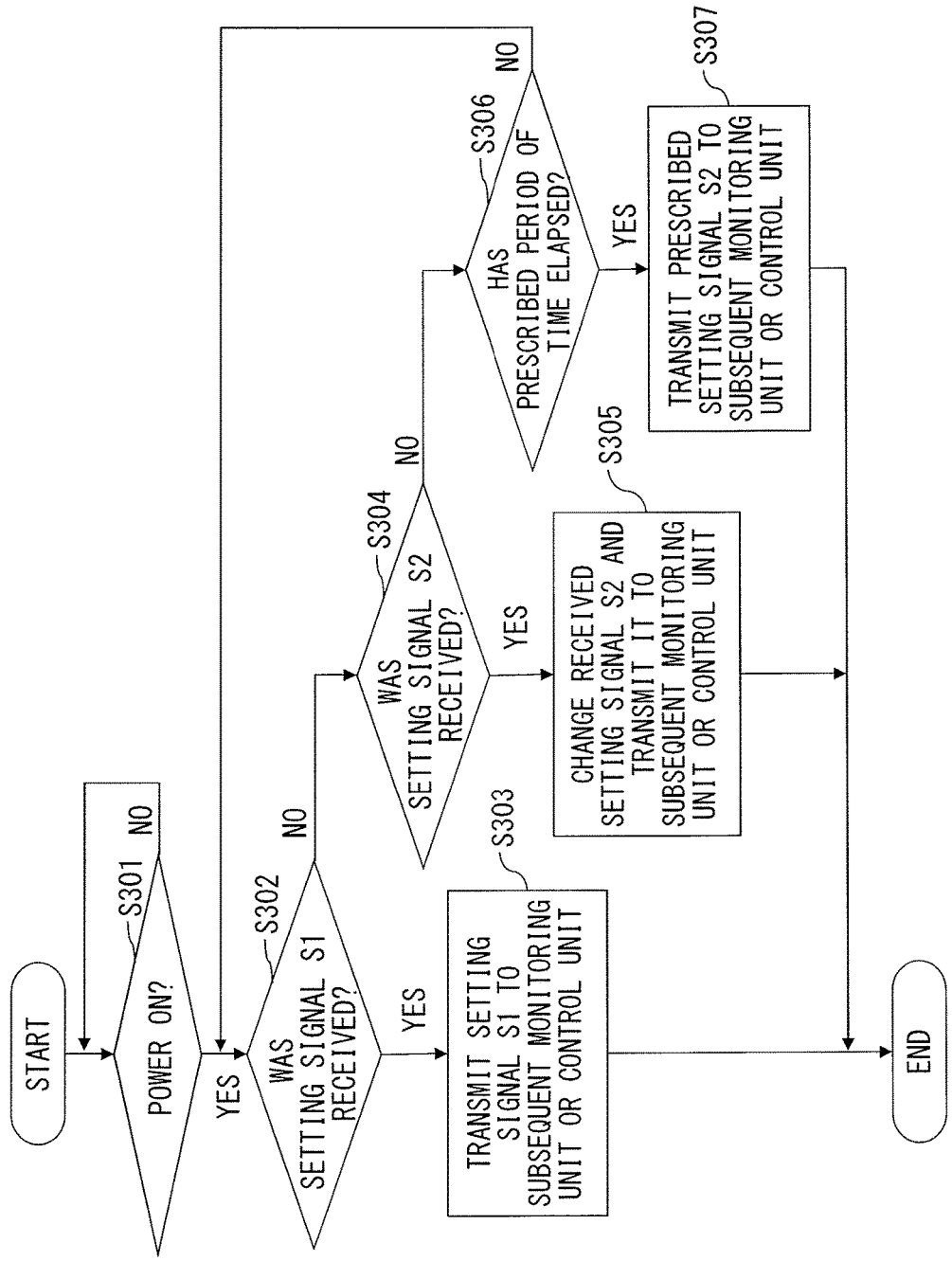
FIG. 3 is a flowchart showing operations of monitoring unit according to the first embodiment.

FIG. 3 is a flowchart showing operations of each of the monitoring units 10-1 through 10-5 according to the first embodiment.

First, when each of the monitoring units 10-1 through 10-5 has its power source turned on (Yes in S301) and receives a setting signal S1 transmitted from the previous monitoring unit 10 or the control unit 3 (Yes in S302), it transmits the setting signal S1 to the subsequent monitoring unit 10 or the control unit 3 (S303). In other words, upon receiving the setting signal S1, each of the monitoring units 10-1 through 10-5 transmits the setting signal S1 to the subsequent monitoring unit 10 or the control unit 3 without changing the setting signal S1. Note that each of the monitoring units 10-1 through 10-5 may transmit the setting signal S1 to the subsequent monitoring unit 10 or the control unit 3 after changing the setting signal S1.

Also, upon receiving a setting signal S2 transmitted from the previous monitoring unit 10 (No in S302 and Yes in S304), each of the monitoring units 10-1 through 10-5 changes received setting signal S2 and transmits it to the subsequent monitoring unit 10 or the control unit 3 (S305).

Also, each of the monitoring units 10-1 through 10-5, when it does not receive the setting signal S1 from the previous monitoring unit 10 or the control unit 3 even after a prescribed period of time has elapsed since its power source has been turned on or when it does not receive the setting signal S2 from the previous monitoring unit 10 even after a prescribed period of time has elapsed since its power source has been turned on (No in S304 and Yes in S306), transmits a prescribed setting signal S2 to the subsequent monitoring unit 10 or the control unit 3 (S307).

It is assumed for example that the information shown in FIG. 4 is stored in the storage unit 13 of each of the monitoring units 10-1 through 10-5 and that the information shown in FIG. 4 and FIG. 5 is stored in the storage unit 17 of the control unit 3. It is also assumed that the communication line between the monitoring units 10-2 and 10-3 is disconnected. It is also assumed that when receiving a rectangular wave equivalent to setting signal S2, each of the monitoring units 10-1 through 10-5 changes the DUTY ratio of the rectangular wave by +4% so as to transmit it to the subsequent monitoring unit 10 or the control unit 3.

In such a case, when the manufacturer of the battery monitoring device 1 or a maintenance person responsible for exchanging the battery modules 2 turns on the power source of the control unit 3 by operating a switch or a service tool, the control unit 3 turns on the power source of each of the monitoring units 10-1 through 10-5 and transmits the rectangular wave with a DUTY ratio of 10% to the first monitoring unit 10-1 as setting signal S1.

Next, upon determining that the received rectangular wave with a DUTY ratio of 10% is equivalent to setting signal S1 by referring to the information shown in FIG. 4, the monitoring unit 10-1 transmits the rectangular wave with a DUTY ratio of 10% to the subsequent monitoring unit 10-2 as setting signal S1.

Next, upon determining that the received rectangular wave with a DUTY ratio of 10% is equivalent to setting signal S1 by referring to the information shown in FIG. 4, the monitoring unit 10-2 transmits the rectangular wave with a DUTY ratio of 10% to the subsequent monitoring unit 10-3 as setting signal S1.

Next, the monitoring unit 10-3, when it does not receive a rectangular wave equivalent to setting signal S1 or S2 before a prescribed period of time has elapsed since its power source has been turned on (when the voltage level remains low or high in the communication line between the monitoring units 10-2 and 10-3), transmits a rectangular wave with a DUTY ratio of 54% to the subsequent monitoring unit 10-4 as a prescribed setting signal S2.

Next, upon determining that the received rectangular wave with a DUTY ratio of 54% is equivalent to setting signal S2 by referring to the information shown in FIG. 4, the monitoring unit 10-4 changes the DUTY ratio of the received rectangular wave by +4% and transmits the rectangular wave with a DUTY ratio of 58% to the subsequent monitoring unit 10-5.

Next, upon determining that the received rectangular wave with a DUTY ratio of 58% is equivalent to setting signal S2 by referring to the information shown in FIG. 4, the monitoring unit 10-5 changes the DUTY ratio of the received rectangular wave by +4% and transmits the rectangular wave with a DUTY ratio of 62% to the control unit 3.

Then, upon determining that the rectangular wave with a DUTY ratio of 62% transmitted from the last monitoring unit 10-5 is equivalent to setting signal S2 by referring to the information shown in FIG. 4, the control unit 3 determines the occurrence location of a communication abnormality corresponding to the DUTY ratio of 62% of the received rectangular wave is "between the monitoring units 10-2 and 10-3" by referring to the information shown in FIG. 5.

Note that determining that the rectangular wave with a DUTY ratio of 10% transmitted from the last monitoring unit 10-5 is setting signal S1 by referring to the information shown in FIG. 4, the control unit 3 determines that a communication abnormality has not occurred.

It is also possible for the control unit 3 to report the occurrence location of a communication abnormality to the user (such as the manufacturer of the battery monitoring device 1 or a maintenance person responsible for exchanging the battery modules 2) after identifying the occurrence location of the communication abnormality.

Further, the amounts of change of the DUTY ratios of rectangular waves caused by the monitoring units 10-1 through 10-5 are not limited to 4%.

As described above, in the battery monitoring device 1 of the first embodiment, because setting signal S2 is changed in a monitoring unit 10 located downstream from the occurrence location of a communication abnormality and the occurrence location of the communication abnormality is identified by setting signal S2 transmitted from the last monitoring unit 10-5 to the control unit 3, it is possible to perform a communication abnormality detection process even when the control unit 3 and the monitoring units 10-1 through 10-5 are connected in series to form a loop. This makes it possible to identify the occurrence location of a communication abnormality prior to the identification information setting process and thereby makes it possible to prevent a malfunction of the battery monitoring device 1 due to the communication abnormality.

Also, the battery monitoring device 1 of the first embodiment employs a configuration of performing a communication abnormality detection process by using a rectangular wave having a DUTY ratio that changes by a consistent changing amount, making it possible to employ a simpler configuration for the monitoring units 10 than in a case when a communication abnormality detection process is performed by using a signal that requires complicated processes such as a modulation process, an encoding process, etc.

Second Embodiment

In the battery monitoring device 1 of the second embodiment, an identification information setting process is performed after a communication abnormality detection process.

Figure 6:
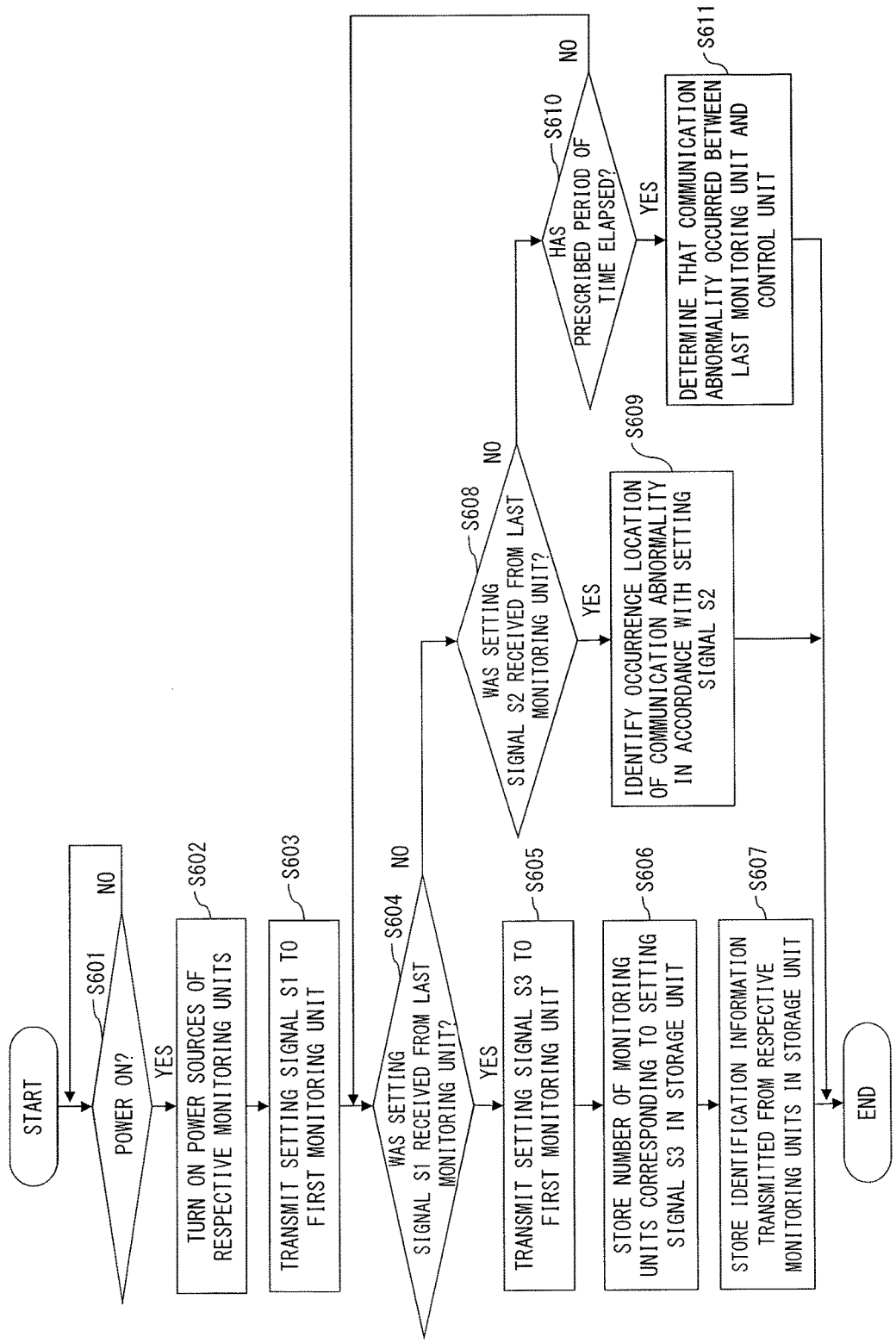
FIG. 6 is a flowchart showing operations of a control unit according to a second embodiment.

FIG. 6 is a flowchart showing operations of the control unit 3 of the second embodiment.

When the power source of the control unit 3 is turned on (Yes in S601), the control unit 3 turns on the power sources of the monitoring units 10-1 through 10-5 (S602) and transmits setting signal S1 (first setting signal) to the first monitoring unit 10-1 (S603).

Next, upon receiving a setting signal S1 transmitted from the last monitoring unit 10-5 (Yes in S604), the control unit 3 transmits setting signal S3 (third setting signal) for the identification information setting process to the first monitoring unit 10-1 (S605).

Next, the control unit 3 stores, in the storage unit 17, the number of the monitoring units 10 that correspond to setting signal S3 transmitted from the last monitoring unit 10-5 (S606), and stores the identification information transmitted from the monitoring units 10-1 through 10-5 in the storage unit 17 (S607).

Also, upon receiving a setting signal S2 (second setting signal) transmitted from the last monitoring unit 10-5 to indicate an occurrence of a communication abnormality (No in S604 and Yes in S608), the control unit 3 identifies the occurrence location of the communication abnormality in accordance with received setting signal S2 (S609).

Also, the control unit 3, when it does not receive setting signal S1 or S2 from the last monitoring unit 10 even after a prescribed period of time has elapsed since it has transmitted setting signal S1 to the first monitoring unit 10-1 (No in S608 and Yes in S610), determines that a communication abnormality has occurred between the last monitoring unit 10-5 and the control unit 3 (S611).

Figure 7:
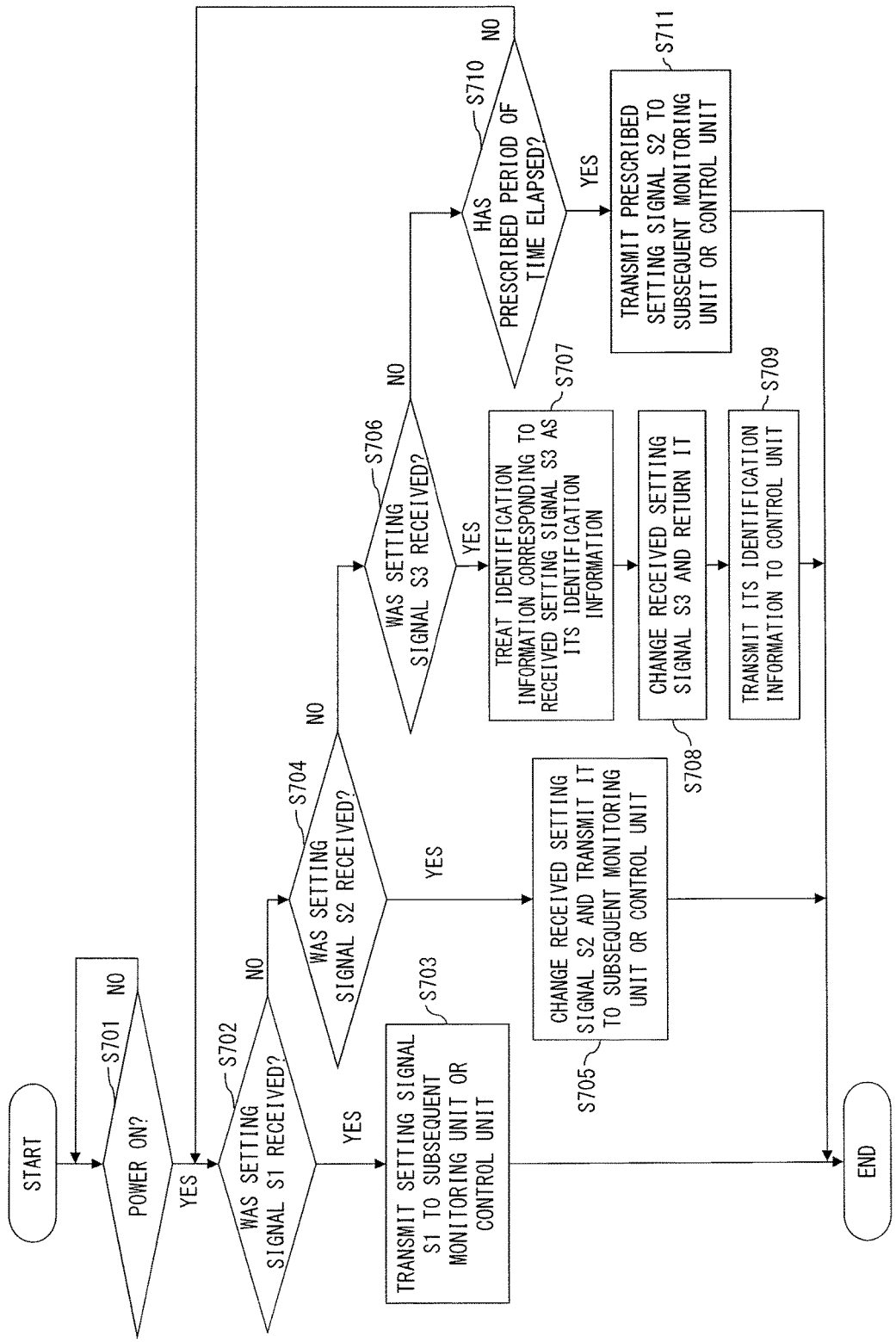
FIG. 7 is a flowchart showing operations of monitoring unit according to the second embodiment.

FIG. 7 is a flowchart showing operations of each of the monitoring units 10-1 through 10-5 of the second embodiment.

First, when each of the monitoring units 10-1 through 10-5 has its power source turned on (Yes in S701) and receives a setting signal S1 transmitted from the previous monitoring unit 10 or the control unit 3 (Yes in S702), it transmits the setting signals S1 to the subsequent monitoring unit 10 or the control unit 3 (S703).

Also, upon receiving a setting signal S2 transmitted from the previous monitoring unit 10 (No in S702 and Yes in S704), each of the monitoring units 10-1 through 10-5 changes received setting signal S2 and transmits it to the subsequent monitoring unit 10 or the control unit 3 (S705).

Also, upon receiving a setting signals S3 transmitted from the previous monitoring unit 10 or the control unit 3 (No in S704 and Yes in S706), each of the monitoring units 10-1 through 10-5 sets the identification information corresponding to received setting signal S3 as its identification information (S707), changes received setting signal S3 so as to transmit it to the subsequent monitoring unit 10 or the control unit 3 (S708), and transmits its identification information to the control unit 3 (S709). Note that the communication line used for transmitting identification information from the monitoring units 10-1 through 10-5 to the control unit 3 may be different from that used for transmitting setting signals S1 through S3.

Also, each of the monitoring units 10-1 through 10-5, when it does not receive the setting signal S1 or S3 from the previous monitoring unit 10 or the control unit 3 even after a prescribed period of time has elapsed since its power source has been turned on or when it does not receive the setting signal S2 from the previous monitoring unit 10 even after a prescribed period of time has elapsed since its power source has been turned on (No in S706 and Yes in Ss710), transmits a prescribed setting signal S2 to the subsequent monitoring unit 10 or the control unit 3 (S711).

It is assumed for example that the information shown in FIG. 8 and FIG. 9 is stored in the storage unit 13 of each of the monitoring units 10-1 through 10-5 and that the information shown in FIG. 8 and FIG. 10 is stored in the storage unit 17 of the control unit 3. It is also assumed that a communication abnormality has not occurred. It is also assumed that when receiving a rectangular wave equivalent to setting signal S3, each of the monitoring units 10-1 through 10-5 changes the DUTY ratio of the rectangular wave by +4% so as to transmit it to the subsequent monitoring unit 10 or the control unit 3.

In such a case, when the manufacturer of the battery monitoring device 1 or a maintenance person responsible for exchanging the battery modules 2 turns on the power source of the control unit 3 by operating a switch or a service tool, the control unit 3 turns on the power source of each of the monitoring units 10-1 through 10-5 and transmits the rectangular wave with a DUTY ratio of 10% to the first monitoring unit 10-1 as setting signal S1.

Next, upon determining that the received rectangular wave with a DUTY ratio of 10% is equivalent to setting signal S1 by referring to the information shown in FIG. 8, the monitoring unit 10-1 transmits the rectangular wave with a DUTY ratio of 10% to the subsequent monitoring unit 10-2 as setting signal S1.

Next, upon determining that the received rectangular wave with a DUTY ratio of 10% is equivalent to setting signal S1 by referring to the information shown in FIG. 8, the monitoring unit 10-2 transmits the rectangular wave with a DUTY ratio of 10% to the subsequent monitoring unit 10-3 as setting signal S1.

Next, upon determining that the received rectangular wave with a DUTY ratio of 10% is equivalent to setting signal S1 by referring to the information shown in FIG. 8, the monitoring unit 10-3 transmits the rectangular wave with a DUTY ratio of 10% to the subsequent monitoring unit 10-4 as setting signal S1.

Next, upon determining that the received rectangular wave with a DUTY ratio of 10% is equivalent to setting signal S1 by referring to the information shown in FIG. 8, the monitoring unit 10-4 transmits the rectangular wave with a DUTY ratio of 10% to the subsequent monitoring unit 10-5 as setting signal S1.

Next, upon determining that the received rectangular wave with a DUTY ratio of 10% is equivalent to setting signal S1 by referring to the information shown in FIG. 8, the monitoring unit 10-5 transmits the rectangular wave with a DUTY ratio of 10% to the control unit 3 as setting signal S1.

Next, upon determining that the received rectangular wave with a DUTY ratio of 10% is equivalent to setting signal S1 by referring to the information shown in FIG. 8, the control unit 3 transmits the rectangular wave with a DUTY ratio of 4% to the first monitoring unit 10-1 as a prescribed setting signal S3.

Next, upon determining that the received rectangular wave with a DUTY ratio of 4% is equivalent to setting signal S3 by referring to the information shown in FIG. 8, the monitoring unit 10-1 refers to the information shown in FIG. 9 so as to set "101", which corresponds to the DUTY ratio of 4%, as its identification information, and changes the DUTY ratio of the received rectangular wave by +4% so as to transmit the rectangular wave with a DUTY ratio of 8% to the subsequent monitoring unit 10-2.

Next, upon determining that the received rectangular wave with a DUTY ratio of 8% is equivalent to setting signal S3 by referring to the information shown in FIG. 8, the monitoring unit 10-2 refers to the information shown in FIG. 9 so as to set "102", which corresponds to a DUTY ratio of 8%, as its identification information, and changes the DUTY ratio of the received rectangular wave by +4% so as to transmit the rectangular wave with a DUTY ratio of 12% to the subsequent monitoring unit 10-3.

Next, upon determining that the received rectangular wave with a DUTY ratio of 12% is equivalent to setting signal S3 by referring to the information shown in FIG. 8, the monitoring unit 10-3 refers to the information shown in FIG. 9 so as to set "103", which corresponds to the DUTY ratio of 12%, as its identification information, and changes the DUTY ratio of the received rectangular wave by +4% so as to transmit the rectangular wave with a DUTY ratio of 16% to the subsequent monitoring unit 10-4.

Next, upon determining that the received rectangular wave with a DUTY ratio of 16% is equivalent to setting signal S3 by referring to the information shown in FIG. 8, the monitoring unit 10-4 refers to the information shown in FIG. 9 so as to set "104", which corresponds to the DUTY ratio of 16%, as its identification information, and changes the DUTY ratio of the received rectangular wave by +4% so as to transmit the rectangular wave with a DUTY ratio of 20% to the subsequent monitoring unit 10-5.

Next, upon determining that the received rectangular wave with a DUTY ratio of 20% is equivalent to setting signal S3 by referring to the information shown in FIG. 8, the monitoring unit 10-5 refers to the information shown in FIG. 9 so as to set "105", which corresponds to the DUTY ratio of 20%, as its identification information, and changes the DUTY ratio of the received rectangular wave by +4% so as to transmit the rectangular wave with a DUTY ratio of 24% to the control unit 3.

Then, upon determining that the received rectangular wave with a DUTY ratio of 24% is equivalent to setting signal S3 by referring to the information shown in FIG. 8, the control unit 3 refers to the information shown in FIG. 10 so as to store "5", which corresponds to a DUTY ratio of 24%, in the storage unit 17 as the number of the monitoring units 10. Thereafter, the control unit 3 stores in the storage unit 17 pieces of identification information "101" through "105" transmitted from the monitoring units 10-1 through 10-5.

Note that the example of the communication abnormality detection process that uses setting signal S2 in the second embodiment is similar to that of the communication abnormality detection process that uses setting signal S2 in the first embodiment, and the explanations thereof will be omitted.

As described above, also in the battery monitoring device 1 of the second embodiment, because setting signal S2 is changed in a monitoring unit 10 located downstream from the occurrence location of a communication abnormality and the occurrence location of the communication abnormality is identified by setting signal S2 transmitted from the last monitoring unit 10-5 to the control unit 3, it is possible to perform a communication abnormality detection process even when the control unit 3 and the monitoring units 10-1 through 10-5 are connected in series to form a loop. This makes it possible to identify the occurrence location of a communication abnormality prior to the identification information setting process and thereby makes it possible to prevent a malfunction of the battery monitoring device 1 due to the communication abnormality.

Also, while the battery monitoring device 1 of the second embodiment employs a configuration in which transmission of setting signal S3 from the control unit 3 to the first monitoring unit 10-1 after transmission of setting signal S1 from the last monitoring unit 10-5 to the control unit 3 triggers the identification information setting process, it is also possible to employ a configuration in which when the monitoring units 10-1 through 10-5 change received setting signals S1 so as to transmit setting signals S1 to the subsequent monitoring units 10 or the control unit 3 and the monitoring units 10-1 through 10-5 set their identification information in accordance with received setting signals S1 if setting signals S2 are not received before the elapse of a prescribed period of time after the turning on of their power sources.

Third Embodiment

The battery monitoring device 1 of the second embodiment employs a configuration in which an identification information setting process is performed after a communication abnormality detection process, thus taking time to start the identification information setting process.

In view of this, the battery monitoring device 1 of the third embodiment performs a communication abnormality detection process and an identification information setting process simultaneously.

Figure 11:
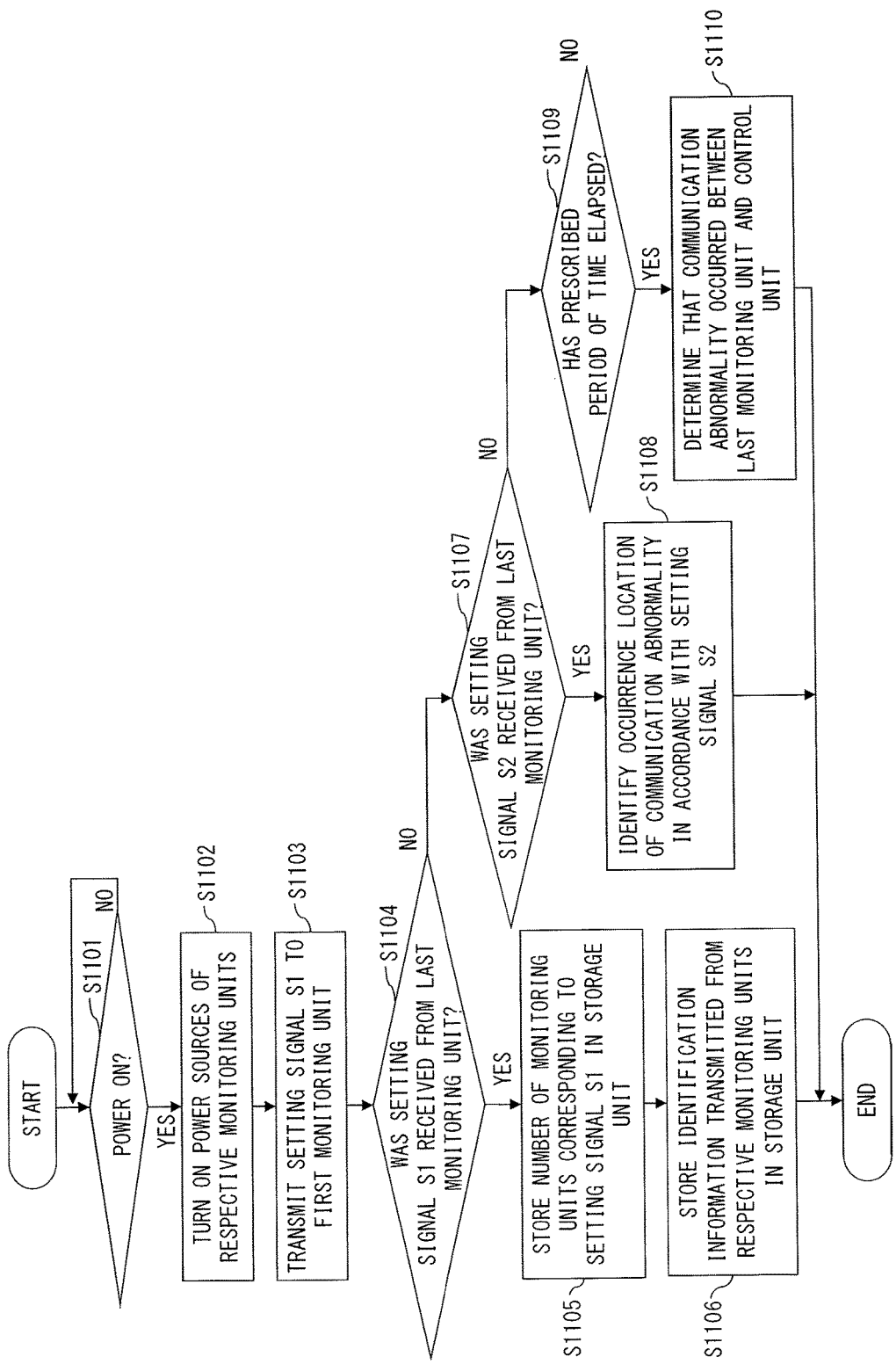
FIG. 11 is a flowchart showing operations of a control unit according to a third embodiment.

FIG. 11 is a flowchart showing operations of the control unit 3 of the third embodiment.

When the power source of the control unit 3 is turned on (Yes in S1101), the control unit 3 turns on the power sources of the monitoring units 10-1 through 10-5 (S1102) and transmits setting signal S1 (first setting signal) for an identification information setting process to the first monitoring unit 10-1 (S1103).

Next, upon receiving a setting signal S1 transmitted from the last monitoring unit 10-5 (Yes in S1104), the control unit 3 stores the number of the monitoring units 10 corresponding to received setting signal S1 in the storage unit 17 (S1105), and stores the identification information transmitted from the monitoring units 10-1 through 10-5 in the storage unit 17 (S1106).

Also, upon receiving a setting signal S2 (second setting signal) transmitted from the last monitoring unit 10-5 to indicate an occurrence of a communication abnormality (No in S1104 and Yes in S1107), the control unit 3 identifies the occurrence location of the communication abnormality in accordance with received setting signal S2 (S1108).

Also, when the control unit 3 has not received setting signal S1 or S2 from the last monitoring unit 10 after the elapse of a prescribed period of time after transmission of setting signal S1 to the first monitoring unit 10-1 (No in S1107 and Yes in 1109), the control unit 3 determines that a communication abnormality has occurred between the last monitoring unit 10-5 and the control unit 3 (S1110).

Figure 12:
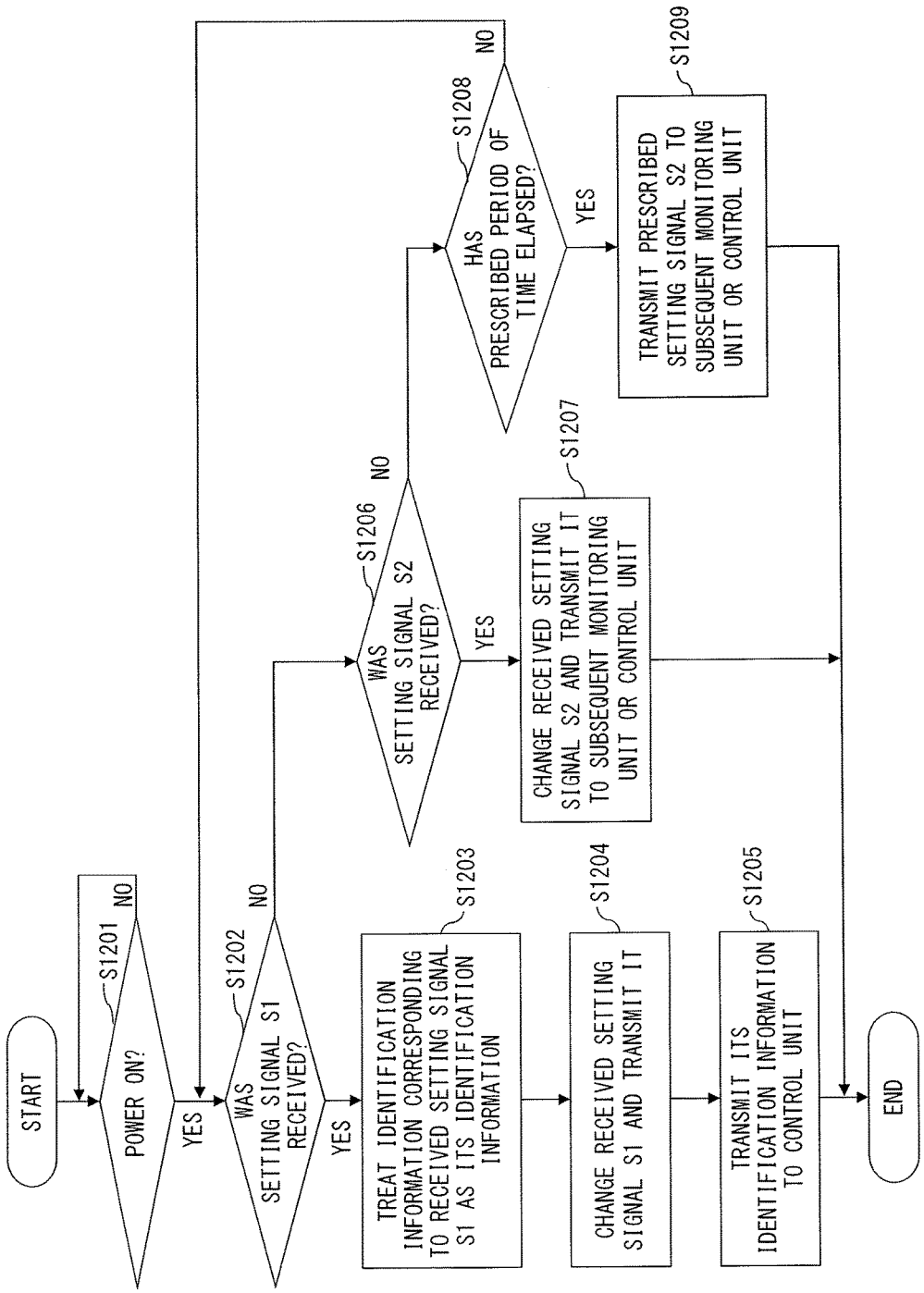
FIG. 12 is a flowchart showing operations of monitoring unit according to the third embodiment.

FIG. 12 is a flowchart showing operations of each of the monitoring units 10-1 through 10-5 according to the third embodiment.

First, when each of the monitoring units 10-1 through 10-5 has its power source turned on (Yes in S1201) and receives a setting signal S1 transmitted from the previous monitoring unit 10 or the control unit 3 (Yes in S1202), it sets the identification information corresponding to received setting signal S1 as its identification information (S1203), changes received setting signal S1 so as to transmit it to the subsequent monitoring unit 10 or the control unit 3 (S1204), and transmits its identification information to the control unit 3 (S1205).

Also, upon receiving a setting signal S2 transmitted from the previous monitoring unit 10 (No in S1202 and Yes in S1206), each of the monitoring units 10-1 through 10-5 changes received setting signal S2 and transmits it to the subsequent monitoring unit 10 or the control unit 3 (S1207).

Also, each of the monitoring units 10-1 through 10-5, when it does not receive the setting signal S1 from the previous monitoring unit 10 or the control unit 3 even after a prescribed period of time has elapsed since its power source has been turned on or when it does not receive the setting signal S2 from the previous monitoring unit 10 even after a prescribed period of time has elapsed since its power source has been turned on (No in S1206 and Yes in S1208), transmits a prescribed setting signal S2 to the subsequent monitoring unit 10 or the control unit 3 (S1209).

It is assumed for example that the information shown in FIG. 9 and FIG. 13 is stored in the storage unit 13 of each of the monitoring units 10-1 through 10-5 and that the information shown in FIG. 5, FIG. 10 and FIG. 13 is stored in the storage unit 17 of the control unit 3. It is also assumed that the communication line between the monitoring units 10-2 and 10-3 is disconnected. It is also assumed that when receiving a rectangular wave equivalent to setting signal S1 or S2, each of the monitoring units 10-1 through 10-5 changes the DUTY ratio of the rectangular wave by +4% so as to transmit it to the subsequent monitoring unit 10 or the control unit 3.

In such a case, when the manufacturer of the battery monitoring device 1 or a maintenance person responsible for exchanging the battery modules 2 turns on the power source of the control unit 3 by operating a switch or a service tool, the control unit 3 turns on the power source of each of the monitoring units 10-1 through 10-5 and transmits the rectangular wave with a DUTY ratio of 4% to the first monitoring unit 10-1 as a prescribed setting signal S1.

Next, upon determining that the received rectangular wave with a DUTY ratio of 4% is equivalent to setting signal S1 by referring to the information shown in FIG. 13, the monitoring unit 10-1 refers to the information shown in FIG. 9 so as to set "101", which corresponds to the DUTY ratio of 4%, as its identification information, and changes the DUTY ratio of the received rectangular wave by +4% so as to transmit the rectangular wave with a DUTY ratio of 8% to the subsequent monitoring unit 10-2.

Next, upon determining that the received rectangular wave with a DUTY ratio of 8% is equivalent to setting signal S1 by referring to the information shown in FIG. 13, the monitoring unit 10-2 refers to the information shown in FIG. 9 so as to set "102", which corresponds to the DUTY ratio of 8%, as its identification information, and changes the DUTY ratio of the received rectangular wave by +4% so as to transmit the rectangular wave with a DUTY ratio of 12% to the subsequent monitoring unit 10-3.

Next, the monitoring unit 10-3, when it does not receive a rectangular wave equivalent to setting signal S1 or S2 before a prescribed period of time has elapsed since its power source has been turned on (when the voltage level remains low or high in the communication line between the monitoring units 10-2 and 10-3), transmits a rectangular wave with a DUTY ratio of 54% corresponding to a prescribed setting signal S2 to the subsequent monitoring unit 10-4.

Next, upon determining that the received rectangular wave with a DUTY ratio of 54% is equivalent to setting signal S2 by referring to the information shown in FIG. 13, the monitoring unit 10-4 changes the DUTY ratio of the received rectangular wave by +4% and transmits the rectangular wave with a DUTY ratio of 58% to the subsequent monitoring unit 10-5.

Next, upon determining that the received rectangular wave with a DUTY ratio of 58% is equivalent to setting signal S2 by referring to the information shown in FIG. 13, the monitoring unit 10-5 changes the DUTY ratio of the received rectangular wave by +4% and transmits the rectangular wave with a DUTY ratio of 62% to the control unit 3.

Then, upon determining that the rectangular wave with a DUTY ratio of 62% transmitted from the last monitoring unit 10-5 is equivalent to setting signal S2 by referring to the information shown in FIG. 13, the control unit 3 determines that the occurrence location of a communication abnormality corresponding to the DUTY ratio of 62% of the received rectangular wave is "between the monitoring units 10-2 and 10-3" by referring to the information show in FIG. 5.

It is also possible to employ a configuration in which when the control unit 3 identifies the occurrence location of a communication abnormality, it reports that fact to the user.

Next, explanations will be given for an operation example of the control unit 3 and the monitoring units 10-1 through 10-5 in a case when a communication abnormality has not occurred in the third embodiment.

First, when the manufacturer of the battery monitoring device 1 or a maintenance person responsible for exchanging the battery modules 2 turns on the power source of the control unit 3 by operating a switch or a service tool, the control unit 3 turns on the power source of each of the monitoring units 10-1 through 10-5 and transmits the rectangular wave with a DUTY ratio of 4% to the first monitoring unit 10-1 as a prescribed setting signal S1.

Next, upon determining that the received rectangular wave with a DUTY ratio of 4% is equivalent to setting signal S1 by referring to the information shown in FIG. 13, the monitoring unit 10-1 refers to the information shown in FIG. 9 so as to set "101", which corresponds to the DUTY ratio of 4%, as its identification information, and changes the DUTY ratio of the received rectangular wave by +4% so as to transmit the rectangular wave with a DUTY ratio of 8% to the subsequent monitoring unit 10-2.

Next, upon determining that the received rectangular wave with a DUTY ratio of 8% is equivalent to setting signal S1 by referring to the information shown in FIG. 13, the monitoring unit 10-2 refers to the information shown in FIG. 9 so as to set "102", which corresponds to the DUTY ratio of 8%, as its identification information, and changes the DUTY ratio of the received rectangular wave by +4% so as to transmit the rectangular wave with a DUTY ratio of 12% to the subsequent monitoring unit 10-3.

Next, upon determining that the received rectangular wave with a DUTY ratio of 12% is equivalent to setting signal S1 by referring to the information shown in FIG. 13, the monitoring unit 10-3 refers to the information shown in FIG. 9 so as to set "103", which corresponds to the DUTY ratio of 12%, as its identification information, and changes the DUTY ratio of the received rectangular wave by +4% so as to transmit the rectangular wave with a DUTY ratio of 16% to the subsequent monitoring unit 10-4.

Next, upon determining that the received rectangular wave with a DUTY ratio of 16% is equivalent to setting signal S1 by referring to the information shown in FIG. 13, the monitoring unit 10-4 refers to the information shown in FIG. 9 so as to set "104", which corresponds to the DUTY ratio of 16%, as its identification information, and changes the DUTY ratio of the received rectangular wave by +4% so as to transmit the rectangular wave with a DUTY ratio of 20% to the subsequent monitoring unit 10-5.

Next, upon determining that the received rectangular wave with a DUTY ratio of 20% is equivalent to setting signal S1 by referring to the information shown in FIG. 13, the monitoring unit 10-5 refers to the information shown in FIG. 9 so as to set "105", which corresponds to the DUTY ratio of 20%, as its identification information, and changes the DUTY ratio of the received rectangular wave by +4% so as to transmit the rectangular wave with a DUTY ratio of 24% to the control unit 3.

Then, upon determining that the received rectangular wave with a DUTY ratio of 24% is equivalent to setting signal S1 by referring to the information shown in FIG. 13, the control unit 3 refers to the information shown in FIG. 10 so as to store "5", which corresponds to the DUTY ratio of 24%, in the storage unit 17 as the number of the monitoring units 10. Thereafter, the control unit 3 stores in the storage unit 17 pieces of identification information "101" through "105" transmitted from the monitoring units 10-1 through 10-5.

Note that the amounts of changes of the DUTY ratios of rectangular waves caused by the monitoring units 10-1 through 10-5 are not limited to 4%.

The DUTY ratios of rectangular waves equivalent to setting signals S1 and S2 are not particularly limited as long as they are different from each other.

As described above, also in the battery monitoring device 1 of the third embodiment, because setting signal S2 is changed in a monitoring unit 10 located downstream from the occurrence location of a communication abnormality and the occurrence location of the communication abnormality is identified by setting signal S2 transmitted from the last monitoring unit 10-5 to the control unit 3, it is possible to perform a communication abnormality detection process even when the control unit 3 and the monitoring units 10-1 through 10-5 are connected in series to form a loop. This makes it possible to identify the occurrence location of a communication abnormality prior to the identification information setting process and thereby makes it possible to prevent a malfunction of the battery monitoring device 1 due to the communication abnormality.

Also, the battery monitoring device 1 of the third embodiment performs a communication abnormality detection process and an identification information setting process simultaneously, making it possible to perform the identification information setting process swiftly when a communication abnormality has not occurred.

Fourth Embodiment

The third embodiment employs a configuration in which the control unit 3 detects a communication abnormality and a monitoring unit 10 located upstream from the occurrence location of the communication abnormality cannot detect the communication abnormality. This may lead to a situation where pieces of identification information are set for only some of the monitoring units 10, resulting in a duplication of identification information and causing a malfunction of the battery monitoring device 1.

In view of the above, the battery monitoring device 1 of the fourth embodiment performs a communication abnormality detection process and an identification information setting process simultaneously, and in a case of an occurrence of a communication abnormality, the battery monitoring device 1 reports that fact to all the monitoring units.

FIG. 14 is a flowchart showing operations of the control unit 3 of the fourth embodiment.

When the power source of the control unit 3 is turned on (Yes in S1401), the control unit 3 turns on the power sources of the monitoring units 10-1 through 10-5 (S1402) and transmits setting signal S1 (first setting signal) for the identification information setting process to the first monitoring unit 10-1 (S1403).

Next, upon receiving a setting signal S1 transmitted from the last monitoring unit 10-5 (Yes in S1404), the control unit 3 stores, in the storage unit 17, the number of the monitoring units 10 that correspond to received setting signal S1 (S1405), and stores the identification information transmitted from the monitoring units 10-1 through 10-5 in the storage unit 17 (S1406).

Also, upon receiving a setting signal S2 (second setting signal) transmitted from the last monitoring unit 10-5 to indicate the occurrence of a communication abnormality (No in S1404 and Yes in S1407), the control unit 3 change received setting signals S2 so as to transmit them to the first monitoring unit 10-1 (S1408), identifies the occurrence location of the communication abnormality in accordance with received setting signal S2 (S1409).

Also, when the control unit 3 has not received setting signal S1 or S2 from the last monitoring unit 10-5 after the elapse of a prescribed period of time after transmission of setting signal S1 to the first monitoring unit 10-1 (No in S1407 and Yes in 1410), the control unit 3 determines that a communication abnormality has occurred between the last monitoring unit 10-5 and the control unit 3, and transmits a prescribed setting signal S2 to the first monitoring unit 10-1 (S1411).

Figure 15:
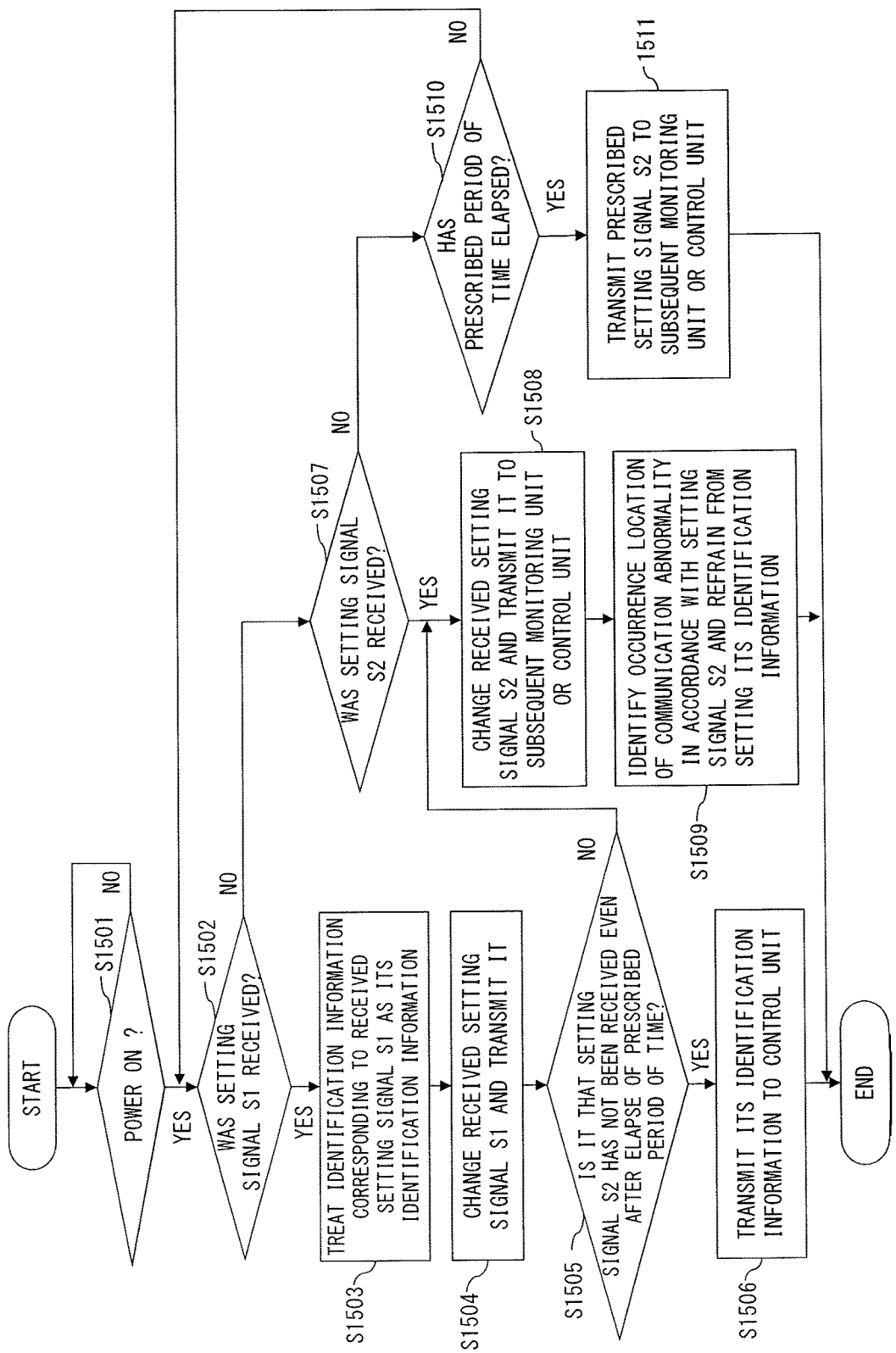
FIG. 15 is a flowchart showing operations of monitoring unit according to the fourth embodiment.

FIG. 15 is a flowchart showing operations of each of the monitoring units 10-1 through 10-5 of the fourth embodiment.

First, when each of the monitoring units 10-1 through 10-5 has its power source turned on (Yes in S1501) and receives a setting signal S1 transmitted from the previous monitoring unit 10 or the control unit 3 (Yes in S1502), each of the monitoring unit 10-1 through 10-5 sets the identification information corresponding to received setting signal S1 as its identification information (S1503), changes received setting signal S1 so as to transmit it to the subsequent monitoring unit 10 or the control unit 3 (S1504), and transmits its identification information to the control unit 3 (S1506) when it is the case that setting signal S2 has not been received even after the elapse of a prescribed period of time after the reception of setting signal S1 (Yes in S1505).

Upon receiving a setting signal S2 before a prescribed period of time elapses after the reception of setting signal S1 (No in S1505), each of the monitoring units 10-1 through 10-5 changes received setting signal S2 so as to transmit it to the subsequent monitoring unit 10 or the control unit 3 (S1508), identifies the occurrence location of the communication abnormality in accordance with received setting signal S2, and refrains from setting its identification information (S1509).

Also, after receiving a setting signal S2 transmitted from the previous monitoring unit 10 or the control unit 3 (No in S1502 and Yes in S1507), each of the monitoring units 10-1 through 10-5 changes received setting signal S2, transmits it to the subsequent monitoring unit 10 or the control unit 3 (S1508), and identifies the occurrence location of the communication abnormality in accordance with received setting signal S2, and refrains from setting its identification information (S1509).

Also, each of the monitoring units 10-1 through 10-5, when it does not receive setting signal S1 or S2 from the previous monitoring unit 10 or the control unit 3 even after a prescribed period of time has elapsed since its power source has been turned on (No in S1507 and Yes in S1510), transmits a prescribed setting signal S2 to the subsequent monitoring unit 10 or the control unit 3 (S1511).

It is assumed for example that the information shown in FIG. 9 and FIG. 13 is stored in the storage unit 13 of each of the monitoring units 10-1 through 10-5 and that the information shown in FIG. 5 and FIG. 13 is stored in the storage unit 17 of the control unit 3. It is also assumed that the information shown in FIG. 16(a) is stored in the storage unit 13 of the monitoring unit 10-1, the information shown in FIG. 16(b) is stored in the storage unit 13 of the monitoring unit 10-2, the information shown in FIG. 16(c) is stored in the storage unit 13 of the monitoring unit 10-3, the information shown in FIG. 16(d) is stored in the storage unit 13 of the monitoring unit 10-4, and the information shown in FIG. 16(e) is stored in the storage unit 13 of the monitoring unit 10-5. It is also assumed that the communication line between the monitoring units 10-2 and 10-3 is disconnected. It is also assumed that when receiving a rectangular wave equivalent to setting signal S1 or S2, each of the monitoring units 10-1 through 10-5 changes the DUTY ratio of the rectangular wave by +4% so as to transmit it to the subsequent monitoring unit 10 or the control unit 3. It is also assumed that when receiving a rectangular wave equivalent to setting signal S2, the control unit 3 changes the DUTY ratio of the rectangular wave by +4% so as to transmit the rectangular wave to the first monitoring unit 10-1.

In such a case, when a manufacturer of the battery monitoring device 1 or a maintenance person responsible for exchanging the battery modules 2 turns on the power source of the control unit 3 through operating a switch or a service tool, the control unit 3 turns on the power source of each of the monitoring units 10-1 through 10-5 and transmits the rectangular wave with a DUTY ratio of 4% to the first monitoring unit 10-1 as a prescribed setting signal S1.

Next, upon determining that the received rectangular wave with a DUTY ratio of 4% is equivalent to setting signal S1 by referring to the information shown in FIG. 13, the monitoring unit 10-1 refers to the information shown in FIG. 9 so as to set "101", which corresponds to the DUTY ratio of 4%, as its identification information, and changes the DUTY ratio of the received rectangular wave by +4% so as to transmit the rectangular wave with a DUTY ratio of 8% to the subsequent monitoring unit 10-2.

Next, upon determining that the received rectangular wave with a DUTY ratio of 8% is equivalent to setting signal S1 by referring to the information shown in FIG. 13, the monitoring unit 10-2 refers to the information shown in FIG. 9 so as to set "102", which corresponds to the DUTY ratio of 8%, as its identification information, and changes the DUTY ratio of the received rectangular wave by +4% so as to transmit the rectangular wave with a DUTY ratio of 12% to the subsequent monitoring unit 10-3.

Next, the monitoring unit 10-3, when it does not receive a rectangular wave equivalent to setting signal S1 or S2 before a prescribed period of time has elapsed since its power source has been turned on (when the voltage level remains low or high in the communication line between the monitoring units 10-2 and 10-3), determines that the occurrence location of the communication abnormality is between the previous monitoring unit 10-2 and itself so as to refrain from setting its identification information, and transmits a rectangular wave with a DUTY ratio of 54% to the subsequent monitoring unit 10-4 as a prescribed setting signals S2.

Next, upon determining that the received rectangular wave with a DUTY ratio of 54% is equivalent to setting signal S2 by referring to the information shown in FIG. 13, the monitoring unit 10-4 determines that the occurrence location of the communication abnormality corresponding to the DUTY ratio of 54% of the received rectangular wave is "between the monitoring units 10-2 and 10-3" so as to refer to the information shown in FIG. 16(d) and refrain from setting its identification information, and changes the DUTY ratio of the received rectangular wave by +4% so as to transmit the rectangular wave with a DUTY ratio of 58% to the subsequent monitoring unit 10-5.

Next, upon determining that the received rectangular wave with a DUTY ratio of 58% is equivalent to setting signal S2 by referring to the information shown in FIG. 13, the monitoring unit 10-5 determines that the occurrence location of the communication abnormality corresponding to the DUTY ratio of 58% of the received rectangular wave is "between the monitoring units 10-2 and 10-3" so as to refer to the information shown in FIG. 16(e) and refrain from setting its identification information, and changes the DUTY ratio of the received rectangular wave by +4% so as to transmit the rectangular wave with a DUTY ratio of 62% to the control unit 3.

Next, upon determining that the rectangular wave with a DUTY ratio of 62% transmitted from the last monitoring unit 10-5 is equivalent to setting signal S2 by referring to the information shown in FIG. 13, the control unit 3 determines that the occurrence location of the communication abnormality corresponding to the DUTY ratio of 62% of the received rectangular wave is "between the monitoring units 10-2 and 10-3" by referring to the information shown in FIG. 5, and changes the DUTY ratio of the received rectangular wave by +4% so as to transmit the rectangular wave with a DUTY ratio of 66% to the first monitoring unit 10-1.

Next, upon determining that the received rectangular wave with a DUTY ratio of 66% is equivalent to setting signal. S2 by referring to the information shown in FIG. 13, the monitoring unit 10-1 determines that the occurrence location of the communication abnormality corresponding to the DUTY ratio of 66% of the received rectangular wave is "between the monitoring units 10-2 and 10-3" so as to refer to the information shown in FIG. 16(a) and refrain from setting its identification information, and changes the DUTY ratio of the received rectangular wave by +4% so as to transmit the rectangular wave with a DUTY ratio of 70% to the subsequent monitoring unit 10-2.

Next, upon determining that the received rectangular wave with a DUTY ratio of 70% is equivalent to setting signal S2 by referring to the information shown in FIG. 13, the monitoring unit 10-2 determines that the occurrence location of the communication abnormality corresponding to the DUTY ratio of 70% of the received rectangular wave is "between the monitoring units 10-2 and 10-3" so as to refer to the information shown in FIG. 16(e) and refrain from setting its identification information.

It is also possible to employ a configuration in which when the control unit 3 identifies the occurrence location of a communication abnormality, it reports that fact to the user.

Note that the amounts of changes of the DUTY ratios of rectangular waves caused by the control unit 3 and the monitoring units 10-1 through 10-5 are not limited to 4%.

The DUTY ratios of rectangular waves equivalent to setting signals S1 and S2 are not particularly limited as long as they are different from each other.

As described above, also in the battery monitoring device 1 of the fourth embodiment, because setting signal S2 is changed in a monitoring unit 10 located downstream from the occurrence location of a communication abnormality and the occurrence location of the communication abnormality is identified by setting signal S2 transmitted from the last monitoring unit 10-5 to the control unit 3, it is possible to perform a communication abnormality detection process even when the control unit 3 and the monitoring units 10-1 through 10-5 are connected in series to form a loop. This makes it possible to identify the occurrence location of a communication abnormality prior to the identification information setting process and thereby makes it possible to prevent a malfunction of the battery monitoring device 1 due to the communication abnormality.

Also, according to the battery monitoring device 1 of the fourth embodiment, when a communication abnormality has occurred, that fact is reported to all the monitoring units 10-1 through 10-5 so that the identification information is not set, thereby preventing a situation where identification information is set for only some of the monitoring units 10 due to a communication abnormality so as to prevent a malfunction of the battery monitoring device 1.

Also, according to the battery monitoring device 1 of the fourth embodiment, even when a communication abnormality has occurred between the last monitoring unit 10-5 and the control unit 3, setting signal S2 transmitted from the control unit 3 to the first monitoring unit 10-1 triggers reporting of the occurrence of the communication abnormality to all the monitoring units 10-1 through 10-5.

Also, according to the battery monitoring device 1 of the fourth embodiment, even when a communication abnormality has occurred in a plurality of locations, setting signals S2 are transmitted respectively from monitoring units located downstream from the respective occurrence locations of the communication abnormality, making it possible to report the occurrence of the communication abnormality to all the monitoring units 10-1 through 10-5.

The first through fourth embodiments employ a configuration in which a communication abnormality detection process and an identification information setting process are performed by using the DUTY ratios of rectangular waves, however it is also possible to perform a communication abnormality detection process and an identification information setting process by using the frequency or the number of pulses per unit time of an oscillation signal including a rectangular wave, the voltage in a communication line, or a numerical value or character information expressed by an oscillation signal including a rectangular wave.

Also, while the first through fourth embodiments employ a configuration in which the control unit 3 transmits setting signal S1 (first setting signal) when its power source is turned on, it may transmit the setting signal S1 when receiving an instruction from a service tool etc.

Also, while the second through fourth embodiments employ a configuration in which the monitoring unit 10 sets identification information corresponding to received setting signal S1 or S3 as its identification information and changes received setting signal S1 or S3 so as to transmit the signal to the subsequent monitoring unit 10 or the control unit 3, these steps may be performed in the reverse order. Specifically, it is also possible for the monitoring unit 10 to change received setting signal S1 or S3 so as to transmit the signal to the subsequent monitoring unit 10 or the control unit 3 and sets identification information corresponding to received setting signal S1 or S3 as its identification information. In other words, as long as the monitoring unit 10 changes the first setting signal so as to transmit the signal to the subsequent monitoring unit 10 or the control unit 3 and sets identification information corresponding to the first setting signal as its identification information, the order of these steps does not matter.

Also, while the second through fourth embodiments employ a configuration in which the control unit 3 stores the number of the monitoring units 10 corresponding to setting signal S1 or S3 transmitted from the last monitoring unit 10-5 in the storage unit 17, the number of the battery modules 2 corresponding to setting signal S1 or S3 may be stored.

Also, the fourth embodiment employs a configuration in which the monitoring unit 10 sets identification information corresponding to received setting signal S1 as its identification information, changes received setting signal S1 so as to transmit it to the subsequent monitoring unit 10 or the control unit 3, and when thereafter receiving a setting signal S2, refrains from setting its identification information; however, it is also possible to employ a configuration in which the monitoring unit 10 changes received setting signal S1 so as to transmit it to the subsequent monitoring unit 10 or the control unit 3, and when thereafter receiving a setting signal S2 during a prescribed period of time, refrains from setting its identification information, and when not receiving a setting signal S2 even after the prescribed period of time has elapsed, sets the identification information corresponding to received setting signal S1 as its identification information. It is sufficient if the monitoring unit 10, when it receives the setting signal S2 after receiving the setting signal S1, refrains from setting identification information corresponding to received setting signal S1 as its identification information.

Also, while the fourth embodiment identifies, in response to reception of setting signal S2, the occurrence location of a communication abnormality in accordance with that received setting signal S2, it is not necessary to identify the occurrence location of the communication abnormality and it is also possible only to refrain from setting its identification information. In such a case, the information shown in FIG. 16 does not have to be stored in the storage unit 13 of each of the monitoring units 10-1 through 10-5.

EXPLANATIONS OF NUMERALS

1: BATTERY MONITORING DEVICE
2: BATTERY MODULE
3: CONTROL UNIT
4: MAIN RELAY
5: BATTERY
6: RELAY
7: VOLTAGE DETECTION UNIT
8: CURRENT DETECTION UNIT
9: TEMPERATURE DETECTION UNIT
10: MONITORING UNIT
11: LOAD
12: RELAY CONTROL UNIT
13: STORAGE UNIT
14: IDENTIFICATION INFORMATION SETTING UNIT
15: COMMUNICATION UNIT
16: RELAY CONTROL UNIT
17: STORAGE UNIT
18: COMMUNICATION ABNORMALITY LOCATION IDENTIFICATION UNIT
19: COMMUNICATION UNIT

What is claimed is:
1. A battery monitoring device comprising:
  a plurality of monitors connected in series that each monitor a state of a battery; and a controller that is connected in series to the plurality of monitors connected in series and that communicates with the plurality of monitors by using identification information set for the plurality of monitors, wherein when any one monitor of the plurality of monitors receives a first setting signal transmitted from one of a previous monitor upstream in the series or from the controller, the one monitor receiving the first setting signal transmits the first setting signal to a subsequent monitor downstream in the series or to the controller when the subsequent monitor is a last monitor in the series, in a case when it is not possible for the one monitor to receive the first setting signal from the previous monitor upstream in the series or from the controller, the one monitor transmits a second setting signal, which indicates an occurrence of a communication abnormality and which is different from the first setting signal, to the subsequent monitor downstream in the series or to the controller when the subsequent monitor is the last monitor in the series, and when receiving the second setting signal transmitted from the previous monitor upstream in the series, the one monitor changes the received second setting signal so as to transmit the changed second setting signal to the subsequent monitor in the series or to the controller when the subsequent monitor is the last monitor in the series, and the controller identifies an occurrence location of a communication abnormality in accordance with the second setting signal transmitted from the last monitor in the series.

2. The battery monitoring device according to claim 1, wherein upon receiving the first setting signal, each of the plurality of monitors changes the received first setting signal so as to transmit the changed first setting signal to the subsequent monitor downstream in the series or to the controller when the subsequent monitor is the last monitor in the series, and sets identification information corresponding to the received first setting signal as identification information thereof, and upon receiving the second setting signal, each of the plurality of monitors refrains from setting identification information thereof.

3. The battery monitoring device according to claim 2, wherein upon receiving the second setting signal transmitted from the last monitor in the series, the controller transmits the second setting signal to a first monitor in the series.

4. The battery monitoring device according to claim 1, wherein upon receiving the first setting signal, each of the plurality of monitors changes the received first setting signal so as to transmit the changed first setting signal to the subsequent monitor downstream in the series or to the controller when the subsequent monitor is the last monitor in the series, and upon not receiving the second setting signal, each of the plurality of monitor sets identification information corresponding to the received first setting signal as identification information thereof after a prescribed period of time has elapsed.

5. The battery monitoring device according to claim 1, wherein upon receiving the first setting signal transmitted from the last monitor in the series, the controller shifts to an identification information setting process.

6. The battery monitoring device according to claim 5, wherein upon receiving the first setting signal transmitted from the last monitor in the series, the controller transmits a third setting signal for an identification information setting process to the first monitor in the series, and upon receiving the third setting signal, each of the plurality of monitors changes the received third setting signal so as to transmit the changed third setting signal to the subsequent monitor downstream in the series or to the controller when the subsequent monitor is the last monitor in the series, and sets identification information corresponding to the received third setting signal as identification information thereof.

7. The battery monitoring device according to claim 1, wherein each of the plurality of monitors changes DUTY ratio, frequency, voltage or number of pulses per unit time of the received second setting signal so as to transmit the changed second setting signal to the subsequent monitor downstream in the series or to the controller when the subsequent monitor is the last monitor in the series.

8. The battery monitoring device according to claim 2, wherein each of the plurality of monitors changes DUTY ratio, frequency, voltage or number of pulses per unit time of the received first setting signal so as to transmit the changed first setting signal to the subsequent monitor downstream in the series or to the controller when the subsequent monitor is the last monitor in the series.

9. The battery monitoring device according to claim 6, wherein each of the plurality of monitors changes DUTY ratio, frequency, voltage or number of pulses per unit time of the received third setting signal so as to transmit the changed third setting signal to the subsequent monitor downstream in the series or to the controller when the subsequent monitor is the last monitor in the series.

10. The battery monitoring device according to claim 4, wherein each of the plurality of monitors changes DUTY ratio, frequency, voltage or number of pulses per unit time of the received first setting signal so as to transmit the changed first setting signal to the subsequent monitor downstream in the series or to the controller when the subsequent monitor is the last monitor in the series.

* * * * *